United States Patent [19]
Harari

[11] 4,328,565
[45] May 4, 1982

[54] NON-VOLATILE EPROM WITH INCREASED EFFICIENCY

[76] Inventor: Eliyahou Harari, 2320 Friars La., Los Altos, Calif. 94022

[21] Appl. No.: 137,764

[22] Filed: Apr. 7, 1980

[51] Int. Cl.³ .............................................. G11C 11/40
[52] U.S. Cl. ........................................ 365/185; 357/23
[58] Field of Search ................... 365/185; 357/23, 41, 357/23 VT

[56] References Cited

U.S. PATENT DOCUMENTS 4,087,795  5/1978  Rossler ................................. 357/23
4,247,916  1/1981  Erb ...................................... 365/185

FOREIGN PATENT DOCUMENTS 2032687  5/1980  United Kingdom .

OTHER PUBLICATIONS

Moller et al., "Programmable Read-Only-Memories", Conference, ISSCC 77, pp. 188-189, S7466 00014, Feb. 16-18, 1977.
Rossler, "Electrically Erasable and Reprogrammable Read-Only Memory Using the N-Channel SIMOS One-Transistor Cell," IEEE Trans. on Electron Devices, vol. ED-24, No. 5, 5/77, pp. 606-610.

*Primary Examiner*—Stuart N. Hecker
*Attorney, Agent, or Firm*—Alan H. MacPherson; Steven F. Caserza; Richard Franklin

[57] ABSTRACT

The floating gate in an N channel EPROM cell extends over the drain diffusion and over a portion of the channel thereby to form a "drain" capacitance between the drain and the floating gate and a "channel" capacitance between the channel and the floating gate. A control gate overlaps the floating gate and extends over the remainder of the channel near the source diffusion thereby to form a "control" capacitance between the channel and the control gate. These three capacitances form the coupling for driving each cell. The inversion region in the channel directly under the control gate is established directly by a "write or read access" voltage applied to the control gate. The inversion region in the channel directly under the floating gate is established indirectly through the drain and control capacitances and the channel capacitance by the control gate voltage and by another write access voltage applied to the drain. A cell is erased either by ultraviolet illumination or by electrons from the floating gate tunneling through a region of thinned oxide. The non-symmetrical arrangement of the control gate and floating gate with respect to source and drain allows a very dense array implementation.

11 Claims, 14 Drawing Figures

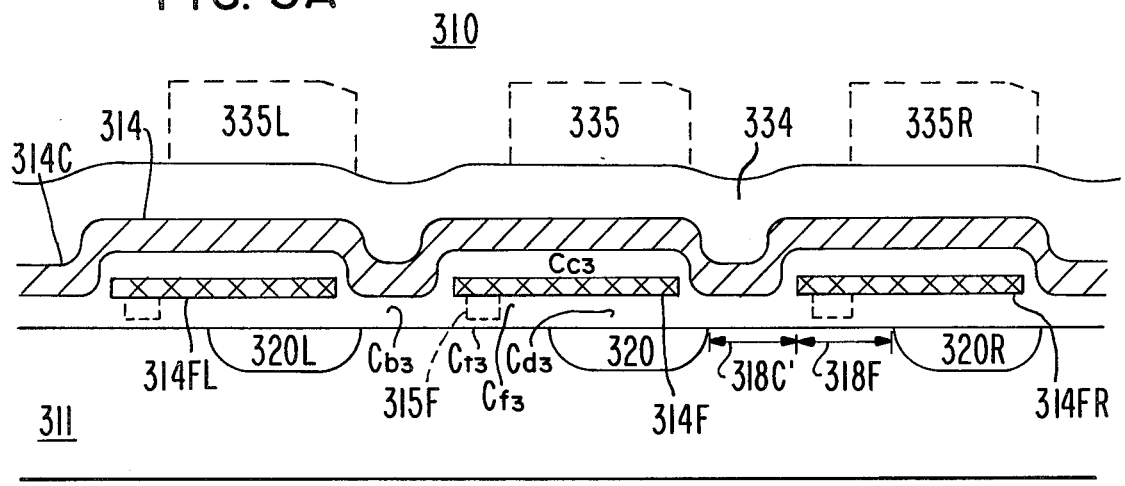
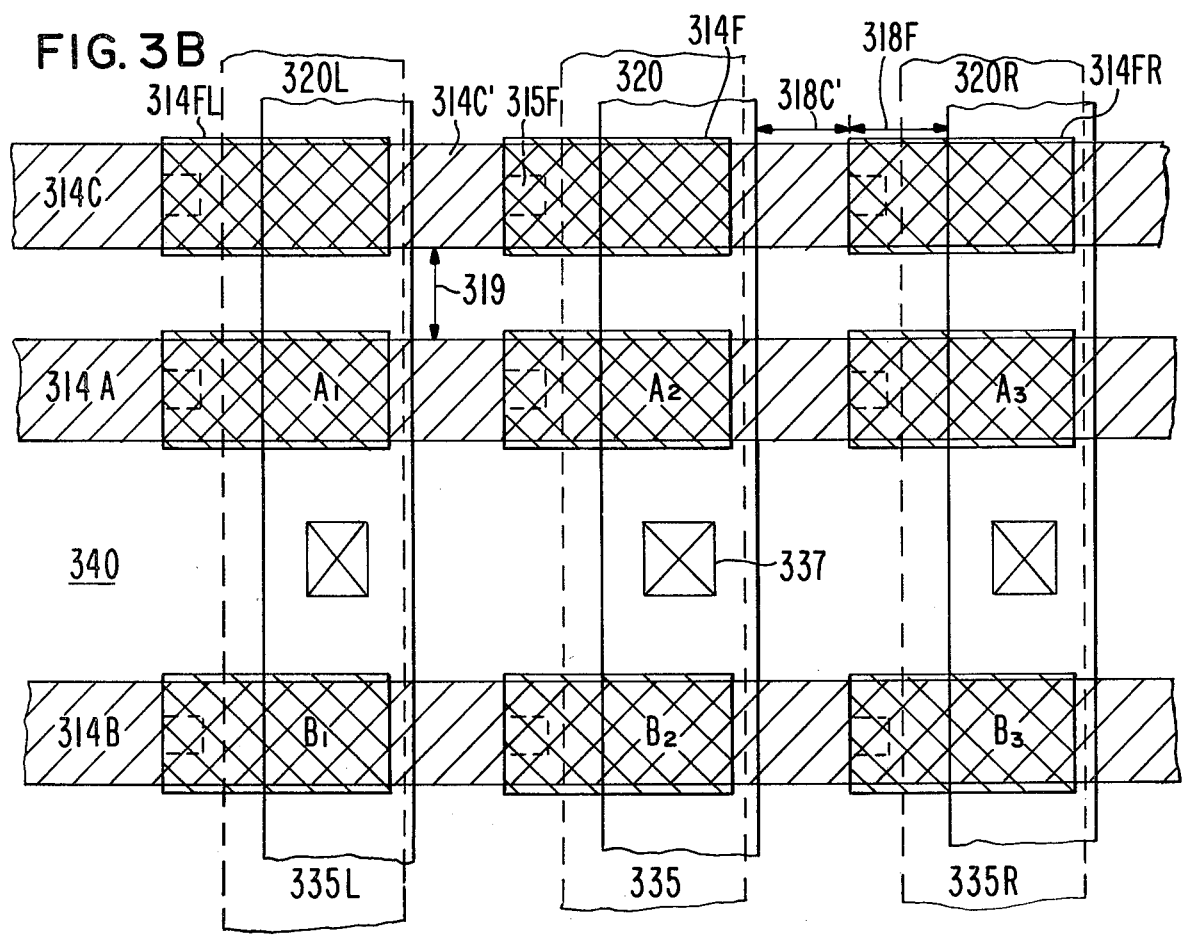

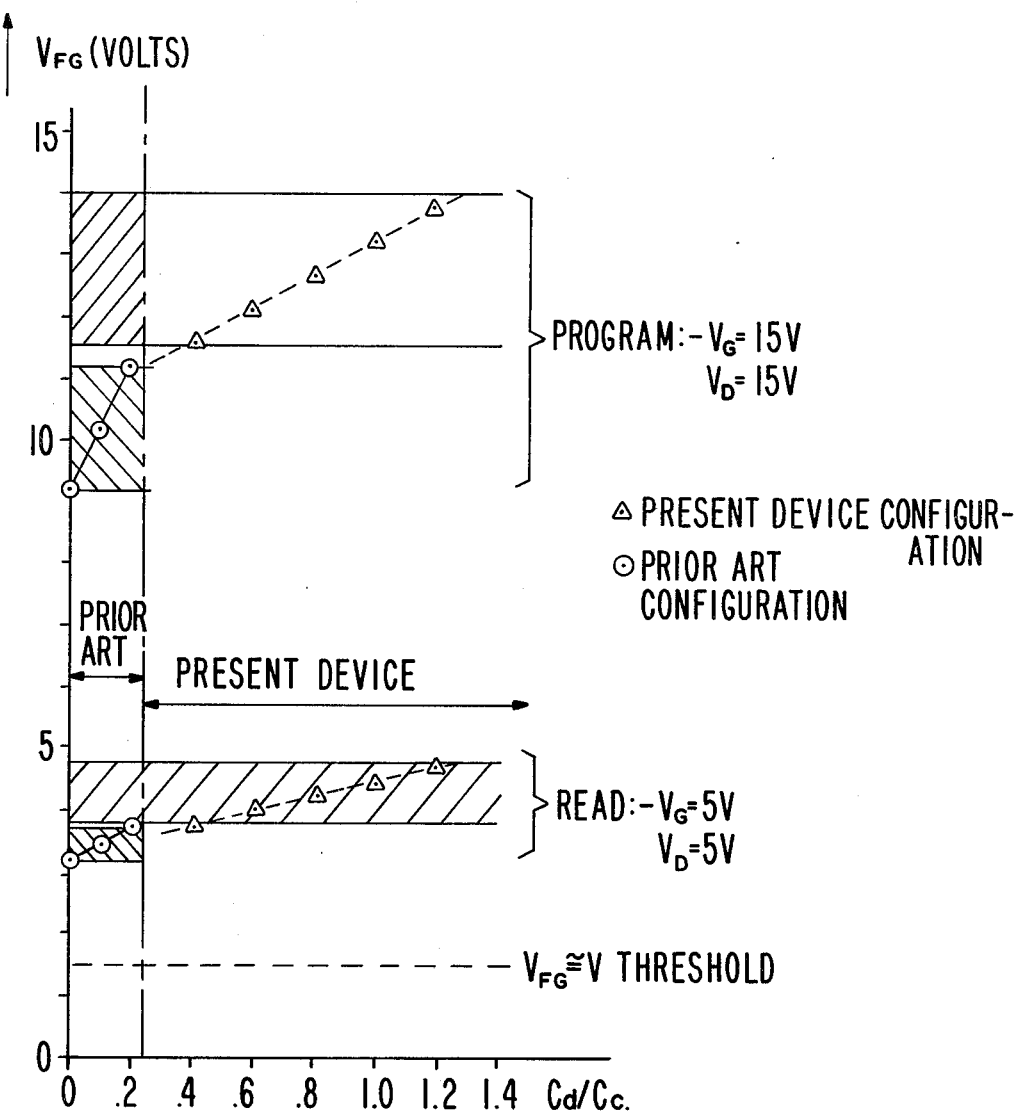
FIG. 4 :— ILLUSTRATING DIFFERENT OPERATING RANGES OF PRIOR ART AND PRESENT DEVICES. THE MAGNITUDE OF $V_{FG}$ CONTROLS INJECTION EFFICIENCY DURING PROGRAMMING AND CHANNEL TRANSCONDUCTANCE DURING READING.

NON-VOLATILE EPROM WITH INCREASED EFFICIENCY

TECHNICAL FIELD

This invention relates to a non-volatile EPROM and more particularly to such an EPROM having a floating gate for controlling the writing and reading of each cell.

BACKGROUND

A prior art device is shown in FIG. 1a. With no charge on floating gate 114F, this device is normally in its low threshold state ($V_T = +1.0$ V). It may be programmed to a high threshold state ($V_T \geq +5$ V) by appling a high voltage $V_D$ to the drain 120D and control gate 114C ($V_D$ is typically 15 V and $V_C$ is typically 20-25 V with the source voltage $V_S = 0$ V, and the substrate bias voltage $V_B = 0$ V). The shifting of the threshold voltage is accomplished through hot electron injection at the drain pinchoff region of the channel, as shown schematically by the arrows beneath floating gate 114F in FIG. 1A. The injected electrons are permanently trapped on the polysilicon floating gate 114F which is isolated from the substrate and control gate by dielectric films 126C and 126F. Film 126F is usually ~1000° A. of thermal oxide. The presence of excess electrons on the floating gate 114F requires $V_C$ to go to a more positive voltage to reach the invention (or "threshold") voltage. A cell written into its high threshold state will not conduct when $V_C$ is +5 V during the read cycle. All devices in the memory array can be erased by illuminating the array with ultraviolet light. This light provides the trapped electrons sufficient energy to escape out of the floating polysilicon into the SiO2 layers above or below it, to be collected in the substrate or by the floating gate (this is known as internal photoemission). Alternatively the array can be erased by applying a strong electric field between the floating gate and the control gate or substrate, resulting in momentary electronic conduction through the respective SiO2 film (this is known as Fowler-Nordheim conduction).

Three key factors control the efficiency of selective writing in a memory array utilizing the device of FIG. 1A. First is the strength of capacitive coupling between the floating gate and control gate (Ccl in FIG. 1B). This depends on the geometric overlap between the two gates and on the thickness and refractive index of the insulating film 126C between the two. Unfortunately, if this film is made too thin, there is the possibility of shorts between the two gates, particulary during the high voltage condition existing during "write". The second and third factors are the channel length L between source and drain, and the channel doping concentration P. The shorter L and the higher P, the more efficient is the hot electron injection mechanism. However, a short L can cause punchthrough between source 120S and drain 120D when the drain is in the high voltage condition, and a high doping P can cause junction avalanche breakdown, also during the high voltage condition. Both phenomena must be avoided absolutely in a memory array.

The prior art has also taught implicitly or explicity that the parasitic capacitances from control gate 114C and floating gate 114F to source 120S and drain 120D adversely affect the operation of cell 110, and must be minimized by critical self alignment techniques. Especially to be minimized is side capacitance Cd1 between floating gate 114F and drain 120D which allow floating gate 114F to follow the potential on drain 120D. During write, because of the high value of $V_D$, every unaddressed cell on the selected column exhibits low level conduction (about 10 microamps) due to Cd1 coupling of the drain to the floating gates of non-accessed cells thereby turning on slightly certain of these cells. A 64K EPROM (256 rows by 256 columns) has a worst case parasitic current due to this effect of several milliamps, an amount above the write current of the addressed cell (1 milliamp). Currents of this magnitude may load the data line voltage and cause errors due to reduced write efficiency. This condition is known as "drain-turn-on".

SUMMARY

In accordance with this invention, previously thought disadvantages of an EPROM structure have been turned to advantage to provide a non-volatile EPROM array which is capable of a faster read cycle through the avoidance of drain turn-on of bit cells connected to the same drain line as the bit cell being read, and which is capable of a more efficient write cycle without sacrificing the efficiency and speed of reading. In the present device, contrary to the prior art, the drain-to-floating gate capacitance Cd1 (FIG. 1B) is deliberately maximized to improve write and read efficiency, and the drain-turn-on condition is avoided by essentially decoupling the floating gate from the source diffusion. Furthermore, the device provides a floating gate capable of attaining a higher capacitively coupled voltage than previously available in the prior art thereby to further improve the efficiency of the write cycle.

In accordance with this invention, a reprogrammable non-volatile EPROM cell comprises a semiconductor substrate containing a source region and a drain region; a floating gate positioned such that a substantial portion of the floating gate is above but isolated from the drain region and the remainder of the floating gate extends over but is insulated from a portion of the channel region between the drain and the source; a control gate insulated from but extending over both the floating gate region and the remainder of the channel region between the source and the drain, that portion of said control gate not over the floating gate being positioned more closely to that portion of the channel region between the source and drain not covered by the floating gate than is the portion of the control gate overlying the floating gate.

In accordance with this invention, the portion of the floating gate overlying the drain region is deliberately more strongly capacitively coupled to the drain region that with floating gate structures of the prior art (which deliberately sought to minimize this coupling capacitance) thereby to allow the floating gate potential to follow more closely the drain potention than previously attained with prior art coupling capacitances. The result is an increase in the vertical field strength accelerating the hot electrons from the pinchoff region of the channel onto the floating gate during the programming of the cell. Concurrently and surprisingly, an additional advantage is that despite the stronger capacitive coupling between the drain and the floating gate during the read operation, the channel between the source and the drain in non-accessed cells is not made conducting by the drain turn-on phenomenon because only a portion of the channel region is covered by the floating gate while the remaining portion of the channel region, covered by the control gate of the device, is held non-conductive by the low potential on this control gate.

One embodiment of this invention involving use of a thin "tunneling" dielectric (such as silicon dioxide or silicon nitride) is easily reprogrammed by dropping the potential on the control gate to a low level (particularly −20 V) while holding the source, drain and substrate at zero volts. The electrons on the floating gate (for an N channel, enhancement mode device) are swept off the floating gate into the substrate of the device thereby deprogramming the particular cell.

During the deprogramming operation of a particular cell, all of the other cells possessing the same control gate are prevented from being discharged by applying a positive voltage of about +20 V to the corresponding drains. This prevents a strong field from being created across the floating gate to the substrate and thus prevents the charge on these other floating gates from being altered. Alternatively, all floating gates associated with a given control gate structure can be erased simultaneously by maintaining the voltage on each of the drains at the voltage of the substrate.

In one embodiment of this invention a region of thin oxide is formed underneath a portion of the floating gate over the channel region. This region of thin oxide allows a floating gate to be reprogrammed using electron tunneling with a relatively high voltage pulse supplied to the floating gate through either its drain capacitance or control gate capacitance.

It is therefore an object of this invention to provide a more dense non-volatile EPROM.

It is another object of this invention to provide a non-volatile EPROM having a higher injection charge density per applied write voltage.

It is a further object of this invention to provide a non-volatile EPROM with a higher drive capacity.

It is a further object of this invention to provide a non-volatile EPROM having more effective injection charge control.

It is a further object of this invention to provide a non-volatile EPROM having a more effective injection charge writing.

It is a further object of this invention to provide a non-volatile EPROM having a greater read threshold window.

It is a further object of this invention to provide a non-volatile EPROM having a greater read current per applied access volt.

It is a further object of this invention to provide a non-volatile EPROM having separate channel portions for access and for injection charge.

It is a further object of this invention to provide a non-volatile EPROM which does not have low level parasitic currents during write or read.

It is a further object of this invention to provide a non-volatile EPROM which can be electrically programmed and electrically erased.

BRIEF DESCRIPTION OF THE DRAWING

Further objects and advantages of the present invention and the operation of the floating gate will become apparent from the following drawing in which:

FIG. 3A is a sectional view of three cells made with the single diffusion embodiment of the increased drive floating gate of FIG. 2; with or without provision for tunnel erase.

FIG. 3B is a top view of a 3×3 array of the single diffusion embodiment of FIG. 3A.

FIG. 4 shows a graph illustrating the relationship between the voltage on the floating gate and the ratio Cd/Cc, for the device of this invention and prior art devices, where Cd is the drain-to-floating gate capacitance and Cc is the control gate to floating gate capacitance.

DETAILED DESCRIPTION

In the detailed description of this invention, certain defined terms will be used as follows:

| | | |
|---|---|---|
| Vwd | = | drain write voltage |
| Vwc | = | control gate write voltage |
| Vrc | = | control gate read voltage |
| Vrd | = | drain read voltage |

Figure 2A:
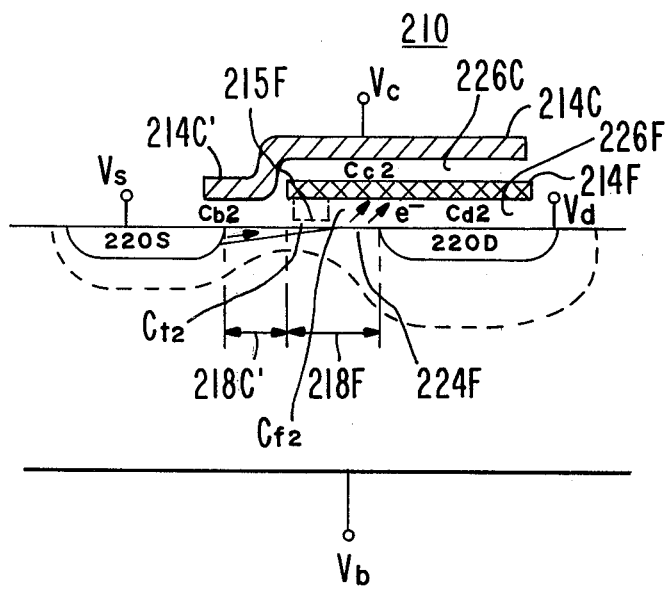
FIG. 2A is a sectional side view of the memory cell of this invention showing the capacitance Cd2 between the floating gate and the drain with or without provision for tunnel erase using a thinner portion 215F of gate dielectric than the remainder of the gate dielectric.
Figure 2B:
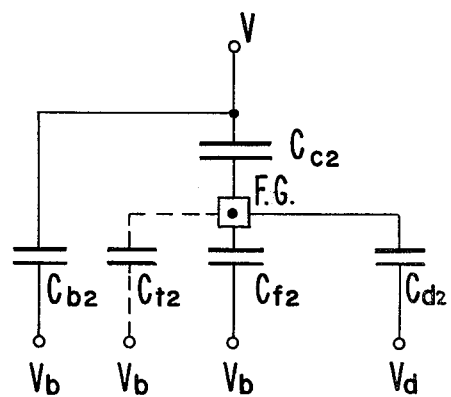
FIG. 2B is a schematic view of the drive capacitances of the cell of FIG. 2A; capacitance Ct2 is present in the tunnel erase embodiment only.

Non-volatile EPROM 210 (FIG. 2A) has a floating gate 214F overlapping most of drain 220D thereby to form a drain-to-floating gate capacitance Cd2, and overlapping with channel portion 218F adjacent to drain 220D forming capacitance Cf2. Control gate 214C extends over floating gate 214F forming Cc2 as in prior art cell 110. However, in addition, control gate 214C has portion 214C' which extends down toward channel portion 218C' adjacent to source 220S thereby to form capacitance Cb2 between control gate portion 214C' and channel portion 218C'. During write, drain write voltage Vwd establishes an accelerating field from source 220S to drain 220D and also redistributes the residual electrons on floating gate 214F through series coupling capacitances Cd2 and Cf2 (see FIG. 2B). A negative charge accumulates on that portion of floating gate 214F comprising part of capacitance Cd2 over drain 220D, and a positive charge accumulates on that portion of floating gate 214F comprising part of capacitance Cf2 over channel portion 218F thereby establishing an inversion region in channel portion 218F. Essentially the drain diffusion 220D is used as a second control gate to create not only a strong lateral electric field between source 220S and drain 220D in response to the write voltage Vwd (applied to the drain in conjunction with the write voltage Vwc on the control gate) but also a strong transverse field across oxide 226F for enhanced hot electron injection from the channel portion 218F to floating gate 214F.

Control gate write voltage Vwc applied to control gate 214C inverts channel portion 218C' through capacitance Cb2, thereby to complete the conductive path across channel 218 of the addressed cell. Control gate write voltage Vwc also assists in the establishment of the inversion in channel portion 218F beneath floating gate 214F across dielectrics 226C and 226F by means of capacitance Cc2. Electrons from source 220S are accelerated laterally along the two inversion regions of channel 218 by drain write voltage Vwd. A tiny fraction of these hot electrons are injected across dielectric 226F into floating gate 214F by the transverse electric field 224F across Cf2 created by the control gate write voltage Vwc and by the drain write voltage Vwd coupled to the floating gate by capacitance Cd2. It is important to note that hot electron injection occurs essentially only in the pinchoff region of channel 218F, that is, within at most 1 micron away from the drain diffusion. This fact is used to great advantage in the high density array shown in FIGS. 3A and 3B to prevent accidental write-disturb, as will be described below.

During read, cells that have been programmed with Qj (the charge on floating gate 214F) have a high threshold and remain non-conductive. However, unprogrammed cells without Qj readily conduct in response to the lower access voltages Vrc and Vrd. The increased drive capacitance in cell 210 over prior art cell 110 (caused by the deliberate increase in the value of capacitance Cd2 relative to the prior art cell 110) results in higher density charge Qj on the floating gate 214F and more channel control without a corresponding increase in cell area or access voltages.

SERIES CHANNEL CONTROL

The series control of channel 218 through two independent capacitances Cf2 and Cb2 prevents low level drain turn-on current across partially addressed cells (i.e, across cells accessed only by Vwd without a corresponding Vwc). N channel inversion must be established in both channel portion 218C' by Vrc (the read voltage applied to control gate 214C during read), and in channel portion 218F by Vrd (the drain voltage applied to drain 220C during read) and Vrc in order to support channel current.

Surface punchthrough across channel 218 is eliminated in non-accessed cells (i.e., in cells to which neither Vrc or Vrd is applied) and partially accessed cells (i.e., in cells to which only Vrd is applied) because of the absence of at least one of the required series inversions. The length of channel 218 may therefore be shortened beyond the punch through limit of prior art cell 110. The division of channel 218 into two independent portions 218C' and 218F for access control, raises the design option of different dopant levels in each portion. The dopant level and hence channel inversion threshold voltage of either or both channel portion may be lowered (or raised) to suit each design application. For example, a lowered threshold in portion 218C' provides increased cell drive during read without adversely affecting the write efficiency, which is dependent on and proportional to the doping concentrations in portion 218F.

HIGH DENSITY SINGLE DIFFUSION EMBODIMENT

The density of the EPROM array may be increased by employing a single diffusion 320 (see FIGS. 3A, 3B) which functions as either the source or the drain, depending on the voltage relationships with the adjacent diffusions 320L and 320R. Each diffusion 320 (such as diffusion 320L, 320 and 320R) in the array 340 forms a bit line shared by all floating gated 314F overlapping it. The control gates 314A, 314B, 314C, et. al. run perpendicular to the diffusions 320, and control the channel conduction through channel portions 318C' and 318F between any two diffusions 320. Each diffusion 320 has a channel portion 318C' and 318F on each side. The space 319 between adjacent rows (such as between rows 314A and 314C) is an isolation region, formed by either a self aligned channel stop ion implantation followed by prolonged oxidation, or by a conventional isoplanar process isolation. The first isolation technique (i.e., channel stop ion implantation) is preferred because it gives higher array density and a more planar topography, and the heavy channel stop boron ion implantation can be used to advantage during write because it substantially raises the channel doping concentration at the edges of the channel as a result of lateral diffusion of the implanted impurities from the isolation region into the channel region during subsequent high temperature processing. The channel edges therefore become the region where programming will preferentially occur. With a heavy channel stop isolation implantation, the channel doping in the rest of the channel 318F, 318C' can be kept just low enough to provide a slightly positive device threshold voltage for an N channel enhancement mode device.

Each diffusion 320 is contacted at the via 337 at every 8 or 16 rows 314 with a metal line 335 running parallel to the diffusion. Note that prior art cell 110 requires a via opening per each two cells, and any non-opened via results in catastrophic array failure. By contrast each via in the array 340 is shared by 8 or 16 cells, and a non-opened via is non-catastrophic since it simply raises somewhat the diffusion bit line resistance, which can be taken into account in the circuit design. The result is an increase in cell density and yield over the prior art.

The process sequence employed with device embodiment 310 is a two polysilicon level process requiring an underlying drain diffusion beneath the floating gate 314F which must be provided early in the process. This requires an additional masking step but the added diffusion can be employed as another level of inter-connect for use in dense peripheral circuitry (standard self-aligned processing does not allow diffusions running under polysilicon). The full process for a dense array embodiment will be described below.

The array 340 requires special write and read voltage conditions to ensure that no accidental programming or erroneous reading takes place. In FIG. 3B, if cell A2 is to be programmed into its high threshold voltage state then column 335 (and thus underlying drain region 320 since column 335 is connected to drain 320 by via 337) is brought to +15 V (i.w., Vwd=15 V) with all other columns at 0 V. Control gate row 314A is brought to ~+20 V (i.e., Vwc=+20 V) with all other rows at OV. Cell A2 now possesses the correct field conditions for hot electron injection (i.e., a horizontal field from source 320L to drain 320 and a vertical field from the N channel between source 320L and drain 320 to floating gate 314F beneath gate 314) and will be programmed by the injection of charge onto floating gate 314F. Cell B2 has the correct Vwd voltage (i.e., drain write voltage) but no channel current since the voltage on control gate 314B is low. Cell A1 has an inverted channel but no accelerating horizontal field since 335L and thus Vwd on drain 320L is low. Cell A3 is the only cell other than A2 with both an accelerating horizontal field between source and drain and an inverted channel with a strong field for hot electron injection. However, because of a low voltage (0 V) on drain 320R and the non-symmetrical nature of cell 310, cell A3 does not have its floating edge overlap the channel pinchoff region, which under the specified voltage conditions occurs within approximately 1 micron from diffusion 320. Therefore, any hot electrons injected from the channel will be collected harmlessly on control gate 314A rather than on the floating gate A3. Note also that the non-symmetrical nature of the structure 310 results in an electric field across Cf3 which is much smaller for A3 than for A2 because the floating gate of A3 is coupled (through capacitance Cd3) to 320R which is at 0 V, while the floating gate of A2 is capacitively coupled to 320, which is at +15 V.

From the above description, it is seen that this invention has turned to advantage the non-symmetrical nature of device 310 to make possible the very dense implementation of array 340. In manufacturing the array, caution must be exercised that the floating gate 314F does not approach by closer than 0.5–1.0 micron the diffusion 320 to its left, i.e., the channel beneath control gate portion 314C' must be sufficiently long, and its doping concentration properly adjusted to prevent accidental write of one cell during the write cycle at an adjacent cell.

It should be noted that if the cell is manufactured such that $Cd_3 > Cc_3$ (thru choice of dielectric film thicknesses and overlap areas) then Vwd rather than Vwc is the dominant voltage during "write" and therefore the voltage on Vwc can be brought to +5 V, same as Vrc. This has the circuit design advantage that th entire row decoding circuitry can now be designed to operate in the low voltage range both for read and for write.

Reading cell A2 can be performed in several ways. One way is to raise all columns 335 to +5 V, with the exception of 335L, which is at 0 V. Row line 314A is also brought up to +5 V with all other rows at 0 V. If A2 is in the low threshold state then it discharges 335 towards 0 V through the series channel between 335 (drain) and 335L (source). The voltage drop on 335 is sensed by a charge sense amplifier at the bottom of the column, which is latched after the voltage on line 335 (or equivalently, the voltage on drain 320) has dropped a few hundred millivolts below +5 V. Cell A3 does not conduct because its source (320) is never allowed to drop by a full transistor threshold voltage below its control gate voltage (314A).

If the cell A2 is in its high threshold state it will not conduct under the conditions set forth in the above paragraph, leaving 335 (or 320) at +5 V. The sense amplifier can compare the voltage drop on 335 with that through a reference cell similar to A2. Because of the added degree of freedom of the present device 210, 310 (FIGS. 2 and 3, respectively) the circuit designer can give the reference cell more or less floating gate-to-drain overlap capacitance Cd2 than the cells in the array, thereby effectively setting the trip-point of the sense amplifier at an intermediate level between "0" and "1" states without the need for complicated means for generating on the chip an intermediate voltage level, which voltage level may in any case be more sensitive to process variations. It should be pointed out, however, that the method described above for write and read is only one of several possible alternatives.

Erase of all cells in array 340 is, as in all prior art floating gate devices, by ultraviolet illumination. A separate embodiment to be described below allows electrical erase at a cost of some additional processing.

INCREASED DISTRIBUTED CAPACITANCE

Figure 1A:
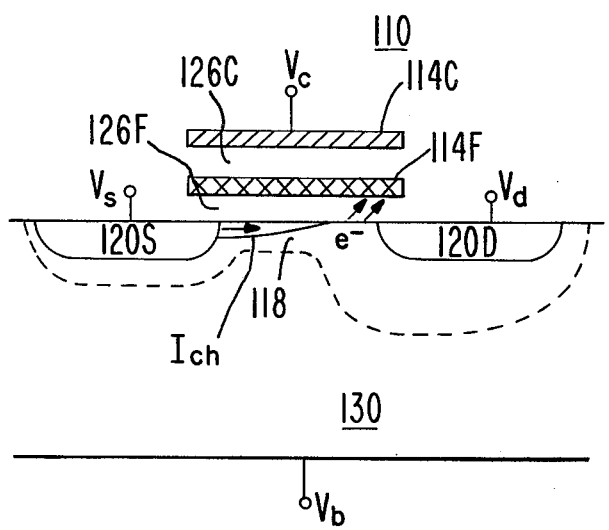
FIG. 1A is a sectional side view of a prior art memory cell.
Figure 1B:
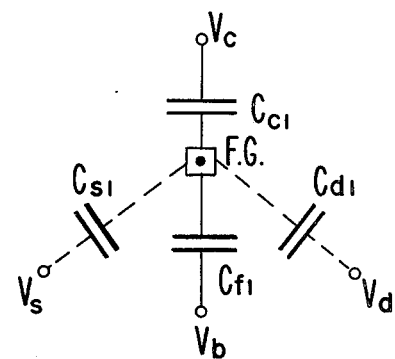
FIG. 1B is a schematic view of the drive capacitances of the cell of FIG. 1A.

Any floating gate device can have its voltage derived from the voltages and capacitances physically coupled to it. For the prior art device 110 this voltage is given by (see FIG. 1B):

$$V_{FG110} = \frac{Q_{FG} + (V_cC_{c1} + V_sC_{s1} + V_dC_{d1})}{(Cd1 + Cf1 + Cs1 + Cd1)} \quad (1)$$

In equation (1) $Q_{FG}$ is the excess charge (negative for electrons) on the floating gate. For a typical 110 device we have the following values:

$$Cd1 = 10\ Co,\ Cf1 = 5\ Co,\ C_{s1} = 0.5\ Co,\ Cd1 = 0.5\ Co,$$

where Co is some unit capacitance whose magnitude depends on the thickness and dielectric constant of the dielectric isolation around 114F. When $Q_{FG} = 0$ (non-programmed device), we have from (1):

$$\text{Read } (V_D = V_G = 5V,\ V_S = V_B = 0V)\ :\ V_{FG\,110} = 3.3V \quad (1a)$$

$$\text{Write } (V_D = V_G = 15V,\ V_S = V_B = 0V)\ :\ V_{FG\,110} = 9.8V \quad (1b)$$

By comparison, the cell 210 of the present invention has its floating gate voltage given by (see FIG. 2B):

$$V_{FG210} = \frac{Q_{FG} + (V_cC_{c2} + V_bCf2 + V_dCd2)}{(Cc2 + Cf2 + Cd2)} \quad (2)$$

For the typical 210 device, using the same unit Co we have the following values:

$$Cc2 = 12\ Co,\ Cf2 = 2.5\ Co,\ Cd2 = 10\ Co.$$

Cc2 is increased relative to Cc1 because of the additional floating gate area over the drain. Cf2 is smaller than Cf1 because only half the channel (218F) is coupled to 214F. Cd2 is increased because of the deliberate drain overlap.

Note also that the dielectric between 214F and the drain is thermally grown on single crystal silicon and can therefore be made thinner, and therefore of higher capacitance per unit area than that for the dielectric constituting Cc2, which is grown on the polycrystalline silicon floating gate material. Cs2 is zero since the floating gate must not overlap the source diffusion. These values give from equation (2) for the case $Q_{FG} = 0$:

$$\text{Read } (V_D = V_C = 5V\ :\ V_S = V_B = 0V)\ \ V_{FG210} = 4.5V \quad (2a)$$

$$\text{Write } (V_D = V_C = 15V\ :\ V_S = V_B = 0V)\ \ V_{FG210} = 13.5V \quad (2b)$$

For maximum drive during read $V_{FG}$ should be as high as possible, to strongly invert the channel 118 or 218F. For the same transistor channel width and length, equations (1a), (2a) show that cell 210 has considerably more drive than cell 110 (the drive is proportional to $(V_{FG} - Vt)^2$ where Vt is the floating gate threshold voltage, $\sim +1.0$ V).

Similarly for maximum injection field during programming $V_{FG}$ should be as high as possible, which from equations (1b), (2b) is much more so for 210 than 110. In addition, since $V_{FG210}$ is higher by 3.7 V than $V_{FG110}$ the net excess charge $Q_{FG}$ stored at the end of the programming pulse is higher by the equivalent 3.7 V in cell 210 over that for cell 110, or, in other words—the voltage window between "0" and "1" states is increased by up to 3.7 V, which permits improved non-volatility. It should be clear from the above discussion that the improved read and write efficiency of cell 210, 310 can be traded in for a smaller (higher density) cell, or lower operating voltages.

Equation (2) also clarifies the statement made earlier about the design flexibility in changing $V_{FG}$ on the reference cell of the sense amplifier by simply increasing or decreasing the Cd2 component.

FIG. A shows that for a ratio of Cd over Cc greater than the prior art limit of about 0.2, the structure of this invention increases the voltage on the floating gate by several volts during the programming mode of operation of the cell and by about 1 volt during the read operation of the cell. The prior art cell operated with a ratio of Cd/Cc of less than 0.2. Thus the relationship of the voltage on the floating gate to the drain voltage of 5 volts, for example, during the read operation is shown by the three dots on the left-most portion of the bottom curve of FIG. 4. With the structure of this invention, the floating gate voltage varies between a little under 4 volts to a little under 5 volts for a drain voltage of 5 volts during read. However with the prior art structure, the floating gate voltage varied between 3 and about 3.75 volts.

Similarly, during the programming operation, a prior art structure yielded a voltage of from about 9 to 11 volts on the floating gate when the capacitance ratio Cd over Cc was less than 0.2. However, with the structure of this invention, the floating gate shows a voltage of about 11.5 to 14 volts for a drain voltage of 15 volts during the programming operation. These higher voltages illustrate the difference between the prior and the present invention and in particular during the programming operation illustrate the increase in injection efficiency during programming and channel transconductance during reading of the cell.

ELECTRICAL ERASE

For a wide range of applications it is inconvenient to use ultraviolet light to erase the charge $Q_{FG}$ on the floating gate. Cells 210, 310 can be modified so that erase can be performed electrically. This is done by the addition of a small region 215F, 315F where the dielectric between floating gate 214F and substrate 218 is sufficiently thin to allow electronic conduction by tunneling under high field conditions. The tunneling current is exponentially dependent of the electric field applied across 315F. For example, at 10 V applied, 315F may conduct a current density of 1 milliamp per cm$^2$ whereas at 8 V applied it will only conduct a current of 1 nanoamp per cm$^2$. The very sharp field dependence is used to advantage in the present embodiment to prevent accidental program or erase in unselected cells.

Writing can be as in 210, 310 by hot electron injection together with some tunneling. As in 210, 310 no hot electron injection occurs in partially selected cells, but in addition no tunneling is allowed in these cells because $V_{FG}$ is below the threshold field for efficient tunneling when only one but not both of $V_D$ and $V_C$ are at the high programming voltage. For example let us assume that the thickness and dielectric constant of 215F is such that $V_{FG}$ must exceed 9 V (with $V_B=0$ V) to achieve tunneling. From equation (2), (assuming Ct2=2 Co) a programmed cell has $V_{FG}=13.5$ V (as before) and will tunnel whereas a partially accessed cell has $V_{FG}=6.8$ V ($V_C=15$ V, $V_D=0$ V) or $V_{FG}=5.7$ V ($V_C=0$ V, $V_D=15$ V), either of which is too low for tunneling. Again the drain coupling Cd2 is used here to advantage to enhance the field at the selected cell, and inhibit it on all non-selected cells in the array.

Erase is performed by applying a pulse of typically $-20$ V to 314 and grounding all column diffusions 320, with substrate 311 also grounded. From equation (2), the cells along the accessed row then have:

$$V_{FG} = \frac{Q_{FG} + (-20 \times 12\, Co)}{C_{Total}} = \left[\frac{Q_{FG}}{C_{Total}} - 10\right] \text{ volts} \quad (3)$$

When $Q_{FG}=0$ (non-programmed) the erase field is weak, but erase by tunneling (electron ejection) will still occur, and is allowed to take the threshold of channel portion 318F into depletion (this would not be allowed were it not for the series channel portion 318C' which remains in enhancement). When $Q_{FG}$ is negative (programmed device) the field due to excess electrons on the floating gate greatly enhances the tunnel erase until all such excess electrons have been removed, for a complete erase. This takes typically 1-10 microseconds.

The cell and memory array structures of this invention are manufactured in accordance with the following process sequence.

Figure 5A:
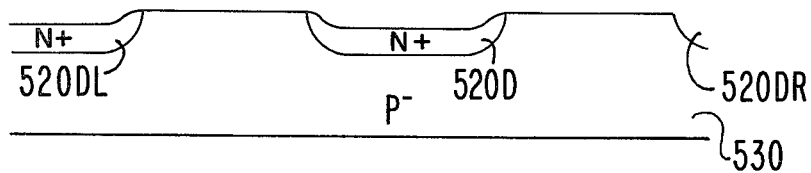
FIGS. 5A through 5G described one process sequence for forming the high density array of this invention.

In one embodiment the process begins with a P-type silicon substrate 530 of approximately ten ohm-centimeters resistivity and with [100] crystallographic orientation (FIG. 5A). Initially, a masking oxide is grown using standard oxidation techniques to a thickness of about 2000 angstroms. Windows are then opened in this oxide through to the underlying substrate in the form of long strips.

A selected impurity (i.e., dopant) such as arsenic or phosphorous is then placed into the substrate through these openings to form a plurality of source-drain regions (520DL, 520D and 520DR, FIG. 5A) of the to-be-formed cells using conventional doping techniques such as diffusion or ion implantation. Typically, the dopant concentration of these regions is such that these regions are of N+ conductivity type (i.e., the dopant concentration is in excess of $10^{18}$ atoms per cubic centimeter). Each region can function as a source or a drain depending on its biasing and thus each of these regions is called a source-drain region.

Next, the structure is oxidized to consume approximately 1000 angstroms of silicon in each source-drain region 520 so as to drive in the dopant and to form a step in the silicon for future mask alignment. The silicon under the masking oxide oxidizes at a much slower rate than the silicon in a source-drain region. This step is followed by stripping all oxide from the wafer.

Next a gate oxide 526F of from 200 to 1000 angstroms thickness, depending upon circuit requirements, is grown over the surface of the wafer. The gate oxidation step is followed by the implantation of a P-type impurity (preferably boron) through the gate oxide 526F to dope the channel region such as region 518L or 518 between each directly adjacent pair of source-drain regions 520 to a surface concentration of $10^{12}$ to $10^{13}$ impurity atoms per square centimeter. This implantation occurs at about 50 KEV. The actual doping level in the channel regions depends upon the desired device threshold and the desired programming voltage.

Figure 5B:
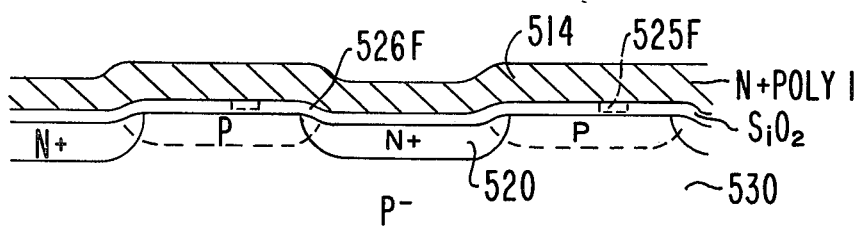

Following boron implantation, polycrystalline silicon 514 is deposited over the surface of the wafer to a thickness of about 1000 to 3000 angstroms using conventional polysilicon deposition techniques (see FIG. 5B).

The polycrystalline silicon is then converted to N+ conductivity type by conventional doping techniques. Typically phosphorous is used to dope the polysilicon although other N-type dopants can also be used if desired.

Figure 5C:
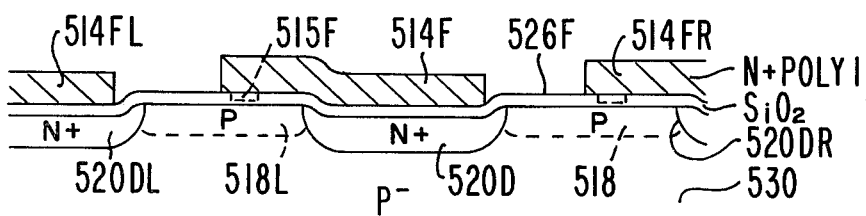
Figure 5D:
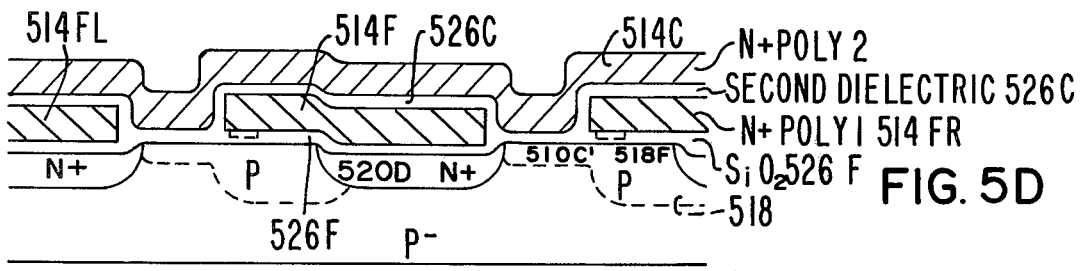
Figure 5E:
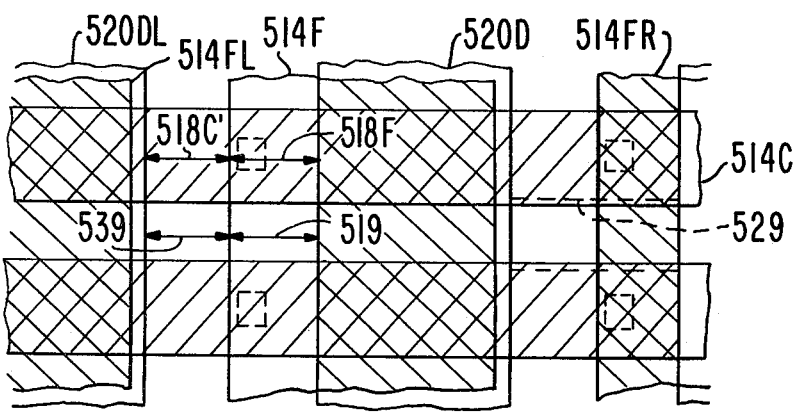

The polycrystalline silicon 514 is next masked and etched using conventional techniques to form a plurality of strips, each strip (such as 514F) being parallel to and directly over part of a uniquely corresponding N+ source-drain region (such as region 520D). Each strip not only overlies a corresponding source-drain region but also overlies a portion of the channel region 518 to the left of this diffusion (the word "left" refers to the left side of the diffused N+ source-drain region 520 when this region is viewed in cross section as shown, for example, in FIG. 3A or FIG. 5C). FIG. 5C shows the structure as it now appears with the P-type substrate 530 containing formed therein the N+ type source-drain regions as exemplified by region 520D, gate oxide 526F formed over the surface of the device, floating gates of polycrystalline silicon as exemplified by gate 514F formed over source-drain region 520 such that a portion of the floating gate 514F extends over the channel region 518L between source-drain region 520D and source-drain region 520DL and P-type channel region 518L and 518 formed on the left and right sides of source-drain region 520.

The polycrystalline silicon strips 514F, 514FL and 514FR, for example, extend along the surface of the device and will be subjected to a second masking and etching operation to delineate the lateral dimensions of each floating gate 514. (The three strips 514FL, 514F and 514FR are exemplary only; it being understood that only a small portion of the total memory array is being shown for illustrative purposes, and that structure similar to that shown extends on both or all sides of that structure shown in, for example, FIGS. 5A to 5G, and FIGS. 3A and 3B.) However, first the structure is oxidized in a well known manner to provide an oxide layer 526C of a selected thickness (typically approximately 1000 angstroms) over the exposed surfaces of each strip 514F of polycrystalline silicon.

Following the formation of oxide 526C, a second polycrystalline silicon layer 514C is deposited to a thickness of approximately 2000–5000 angstroms. Layer 514C will, following a masking and etching step, comprise the gate electrode for a row of memory cells. The resulting structure is shown in cross section in FIG. 5D and is shown in top view in FIG. 5E. At this time, the second polycrystalline silicon layer 514C covers the top surface of the device like a sheet. Underlying this sheet are strips of polycrystalline silicon 514FL, 514F and 514FR (FIG. 5E) and beneath at least a portion of each of these strips is a corresponding source-drain region such as 520DL, 520D and 520DR, respectively.

Prior to the growth of oxide 526C, the device, in one embodiment, is submitted to an oxide etch to partially etch back to 200 angstroms the gate oxide 526F in the exposed regions between polycrystalline silicon strips 514FL, 514F and 514FR. The second oxide layer 526C is then grown on the device. Oxide 526C comprises the interelectrode isolation oxide between the floating gates 514FL, 514F and 514FR (FIGS. 5C, 5D) and the to-be-formed second polycrystalline silicon layer 514C from which the control gate electrodes will be formed.

The oxidation process used to form oxide layer 526C can also be used to substantially reduce the boron concentration in the channel region not covered by the floating gates 514FL, 514F and 514FR by taking advantage of boron redistribution into the grown oxide. This beneficially reduces the threshold voltage of that part of the channel not underlying the floating gate regions 514FL, 514F and 514FR and thereby increase the transconductance of this part of the channel.

Alternatively, the interelectrode isolation 526C can be formed by deposition of silicon nitride or alternatively by a composite structure such as formed by a short oxidation followed by the deposition of silicon nitride. This sandwich structure is of a type well known in the semiconductor arts.

Following the formation of the dielectric 526C, a second conductive layer 514C is deposited. This layer can be polycrystalline silicon or some form of a low resistivity silicide or refractory metal which can withstand subsequent oxidation. Preferably this layer comprises polycrystalline silicon.

Following the formation of the second polycrystalline silicon layer 514C, the device is masked and etched to form strips of polycrystalline layer 514C perpendicular to the previously formed polycrystalline strips 514FL, 514F and 514FR. The etching process is continued through the dielectric 526C and polycrystalline silicon strips 514FL, 514F and 514FR so as to expose the underlying gate oxide 526F. The result is a structure which appears in top view in FIG. 5G but lacking the metal leads 535.

Of importance, the previously described boron field implant between the source-drain regions 520DL, 520D and 520DR can, if desired, be performed at this step in the process. For example, the boron, can at this time be ion implanted through the exposed portions of gate oxide 526F between strips 514C to effectively implant in regions 539 only (see FIG. 5E). This reduces by approximately one-half the junction capacitance of the diffused region 520D, for example, with the channel region and the field since only the right hand side of each diffusion 520 (FIG. 5D) is heavily P doped due to field ion implantation, yet adequate protection is obtained against leakage paths. In this step, the boron is implanted to about 1 to $5 \times 10^{13}$ atoms per square centimeter. The boron implantation is automatically self aligned to the complement area of the first and second polycrystalline silicon layers (514F, 514C) represented by region 539 of FIG. 5E. The N+ diffusions 520D, for example, automatically overcompensate the boron in those regions in which 520D is exposed to the ion implantation. The P-type boron prevents field inversion at high programming voltages applied to the drain and gate electrodes 520D and 514C, respectively, and also enhances the channel doping at the edges 529 (FIG. 5E) of the channel regions of each floating gate device thereby in turn increasing the programming efficiency. This occurs because hot electron injection is more effective in a more highly doped region of the channel then in the more lightly doped regions of the channel. At the same time, however, because only the edges 529 of each channel between source-drain regions 520D and 520DR, for example, (FIG. 5E) have a higher doping concentration, the transconductance of the channel regions 518C¹ and 518F for example are not reduced.

An isolation thermal oxidation step is next performed to grow an isolation thermal oxide layer of about 1000-5000 angstroms thickness over the top surface and field regions of the device. This oxidation also oxidizes the side regions of the first and second polycrystalline silicon layers (514FL, 514F, 514FR and 514C) exposed by the etching operation which forms the second polycrystalline silicon layer 514C into control gate strips and the first polycrystalline silicon layer into isolated floating gates.

Over the thermal oxide (not shown in the drawings) is next deposited a phosphorous-doped pyroglass which is densified and reflowed by conventional thermal processing. The phosphorous doped glass provides additional protection to the device against unwanted contaminants which alter the electrical characteristics of the device.

The remainder of the process is standard.

Figure 5F:
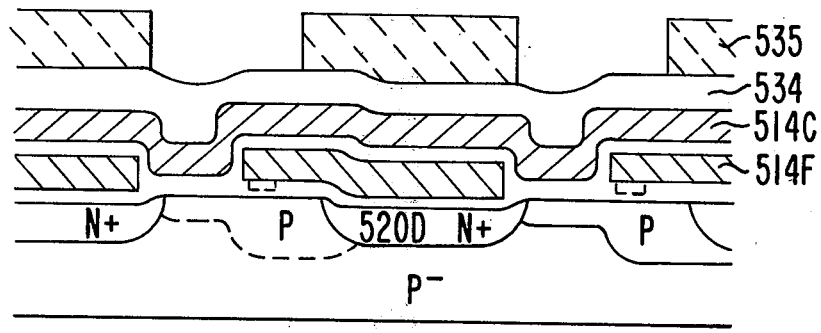
Figure 5G:
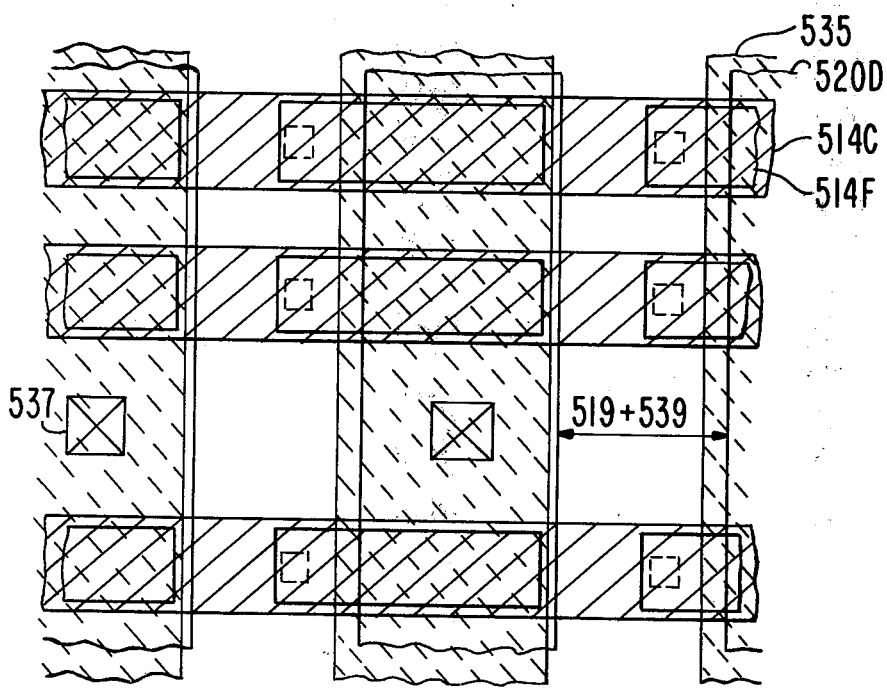

In FIG. 5F is shown the completed structure prior to the deposition of the scratch protection layer. Layer 534 is a phosphorous doped glass reflowed to smooth the surface topography and layer 535 comprises metal lines running parallel to the source-drain regions such as 520D and over the corresponding source-drain region such as 520DL. Contact is made between each metal line 535 and the source-drain region 520 underlying that line every eight to sixteen cells as shown by via 537 in FIG. 5G, a top view of the structure shown in FIG. 5F. This feature greatly increases the array packing density by reducing the number of vias required to contact each source-drain region 520.

The above description relates to the formation of programmable devices in the array only. Transistors used in the periphery of the device for decoding, buffering, and logical operations are processed in a conventional manner using either the first layer polycrystalline silicon or the second layer polycrystalline silicon or metalization for the gate electrodes. These devices may also require additional masking steps such as for the formation of transistors with sources and drains self aligned to the gates. The peripheral circuitry can, of course, be fabricated using conventional isoplaner MOS technology.

Processing for the electrically erasable device (as opposed to the ultraviolet erasable device described above) is identical to that described above except for an additional masking step between the implantation of the boron to form the source-drain regions 520 of the device and the deposition of the polycrystalline silicon from which the floating gate electrodes 514F et.al. are formed. The areas for the thin tunneling dielectric are formed in the oxide 526F beneath the floating gates 514FL, 514F and 514FR for example (FIG. 5D) overlying the channel region away from the source-drain regions 520DL, 520D and 520DR. The gate oxide 526F is then etched away in these defined regions through to the underlying silicon and the structure is then reoxidized to form a gate oxide of approximately 50-150 angstroms.

Alternatively, a thermal nitride is grown to a thickness of about 50-100 angstroms in the exposed region. The processing sequence described above beginning with the depositing of the first polycrystalline silicon layer then follows.

As a feature of this last alternative embodiment, any area of the tunnel oxide exposed when polycrystalline silicon layer 514 is defined and etched will be oxidized to a thickness at which no tunneling can occur during the subsequent oxidation of the wafer to form the interelectrode isoldation oxide 526C.

The device disclosed above lends itself to a particularly dense and compact array. Preferably, in accordance with this invention the ratio of the drain-to-floating gate capacitance Cd to the floating gate-to-control gate capacitance Cc is greater than 0.3. In the prior art this ratio was preferably kept equal to or less than 0.1 FIG. 4 illustrates, as described above, the effective increase in the floating gate potential as a result of the increase in the ratio of these two capacitances.

The structure of this invention, contrary to the prior art structures, prevents drain turn-on during read operation. Interestingly, this structure also avoids the requirements for a higher effective gate voltage due to a positive charge on the floating gate after deprogramming and therefore avoids operating on the right hand portions of the programming efficiency curve by not having an N-region (of a type disclosed in the prior art) underneath the floating gate. Additionally, the structure of this invention can use a control gate solely to turn on the channel directly under the control gate and not under the floating gate. Because the floating gate is controlled by the drain voltage, the drain can provide both the horizontal and vertical accelerating and injecting fluids for use during the programming of the floating gate.

While several embodiments of this invention have been described, other embodiments will be obvious in view of the above disclosure and the description above is meant merely to be illustrative, not limiting.

What is claimed is:

1. A reprogrammable nonvolatile EPROM cell comprising:
   a semiconductor substrate containing a source region and a drain region;
   a floating gate positioned such that a substantial portion of the floating gate is above but insulated from the drain region and the remainder of the floating gate extends over but is insulated from a portion of the channel region between the drain and the source;
   a control gate insulated from but extending over both the floating gate and the remainder of the channel region between the source and the drain such that that portion of the control gate not over the floating gate is positioned more closely to that portion of the channel region between the source and the drain not covered by the floating gate than is the portion of the control gate overlying the floating gate.

2. Structure as in claim 1 wherein a capacitance Cd exists between the drain and the floating gate and a capacitance Cc exists between the floating gate and the control gate and the ratio of Cd to Cc is equal to or greater than approximately 0.1.

3. Structure as in claim 1 wherein the ratio of the capacitance Cd between the drain region and the floating gate to the capacitance Cc between the floating gate and the control gate is equal to or greater than approximately 0.3.

4. Structure as in claim 1 wherein said floating gate comprises a first layer of polycrystalline silicon insulated from the underlying substrate by a first dielectric layer and said control gate comprises a second layer of conductive material insulated from said first layer of polycrystalline silicon by a second dielectric.

5. Structure as in claim 4 wherein said second conductive layer comprises a second layer of polycrystalline silicon.

6. Structure as in claim 1 wherein the channel region between said source and drain regions comprises a middle portion possessing a first selected dopant concentration selected to minimize the threshold voltage required to turn on said cell and wherein the edges of said channel region adjacent to the field of the device are more highly doped in order to increase the efficiency of hot electron injection from the channel into the floating gate during the programming of the cell.

7. A nonvolatile reprogrammable EPROM array containing M×N memory cells, where M is a first selected integer equal to the number of columns of memory cells in the array, and N is a second selected integer equal to the number of rows in the array, comprising:
 a semiconductor substrate of one conductivity type in which are formed a first plurality of M+1 strips of source-drain regions of opposite conductivity type;
 a second plurality of M×N regions of first conductive material comprising M sets of N regions each of first conductive material, each set of N regions of first conductive material being insulated from but formed over a substantial portion of a corresponding one of said source-drain regions, each of said N regions of first conductive material in a set being formed over a portion of a corresponding one of said source-drain regions and over a portion of a channel region in the substrate adjacent to the source-drain region, whereby each of said regions of first conductive material in a given set of N regions of first conductive material is electrically insulated from the underlying source-drain region and the underlying channel region;
 insulation formed over said second plurality of M×N regions of first conductive material;
 a third plurality of N strips of second conductive material formed in a direction perpendicular to the M+1 strips of source-drain regions, said strips of second conductive material overlying and being insulated from said second plurality of M×N regions of first conductive material, M regions in a row from said second plurality of M×N regions of first conductive material underlying but insulated from one of said N strips of second conductive material;
 insulation over said third plurality of N strips of second conductive material;
 a fourth plurality of M+1 conductive strips formed on said insulation overlying and parallel to, on a one-to-one basis said first plurality of M+1 strips of source-drain regions; and
 means for electrically connecting each of said fourth plurality of M+1 conductive strips to a corresponding one of said first plurality of M+1 strips of source-drain regions, said means for electrically connecting comprising selected electrically conductive paths formed between each of said fourth plurality of conductive strips and the underlying one of said source-drain regions, each of said conductive paths being separated from the adjacent conductive paths connecting said conductive strip to said underlying source-drain region by at least k of said third plurality of N strips of second conductive material where k is a selected integer.

8. Structure as in claim 7 wherein k is equal to or greater than eight.

9. Structure as in claim 8 wherein each of the cells in said array of memory cells comprises
 a portion of a first source-drain region overlain by a region of said first conductive material insulated from said first source-drain region, said region of said first conductive material overlying a substantial portion of said first source-drain region and a substantial portion of a channel region adjacent to said first source-drain region;
 insulation overlying said region of said first conductive material;
 a conductive gate insulated from said region of said first conductive material but overlying said region of said first conductive material, said conductive gate extending over a portion of said channel region not covered by said region of said first conductive material, said conductive gate extending closer to said channel region in the area where said channel region is not overlain by said region of said first conductive material;
 insulation overlying said conductive gate; and
 a second source-drain region at the opposite end of said channel region.

10. Structure as in claim 9 including means for applying a first potential to said first source-drain region;
 means for applying a second potential to said conductive gate and
 means for sensing the state of the channel region underlying said conductive gate and said region of said first conductive material during the application of said second potential to said conductive gate and said first potential to said source-drain region.

11. Structure as in claim 9 wherein a portion of the insulation underneath said region of said first conductive material is selectively thinner than the other portions of said insulation thereby to allow electrons to tunnel through said thinner portion of insulation from said region of said first conductive material to the underlying substrate.

* * * * *